(12) United States Patent
Moschiano et al.

(10) Patent No.: US 8,937,836 B2
(45) Date of Patent: *Jan. 20, 2015

(54) LINE VOLTAGE BOOST SYSTEM AND METHOD FOR NON-VOLATILE MEMORY DEVICES AND MEMORY DEVICES AND PROCESSOR-BASED SYSTEM USING SAME

(71) Applicant: Micron Technology, Inc., Boise, ID (US)

(72) Inventors: Violante Moschiano, Avezzano (IT); Giovanni Santin, Rieti (IT); Ercole Di Iorio, Scurcola Marsicana (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/223,734

(22) Filed: Mar. 24, 2014

(65) Prior Publication Data

US 2014/0204674 A1 Jul. 24, 2014

Related U.S. Application Data

(60) Continuation of application No. 13/070,121, filed on Mar. 23, 2011, now Pat. No. 8,681,559, which is a division of application No. 11/795,357, filed as application No. PCT/US2007/068220 on May 4, 2007, now Pat. No. 7,924,616.

(51) Int. Cl.
*G11C 16/04* (2006.01)
*G11C 16/12* (2006.01)
*G11C 5/14* (2006.01)
*G11C 16/08* (2006.01)

(52) U.S. Cl.
CPC ............... *G11C 16/12* (2013.01); *G11C 5/145* (2013.01); *G11C 16/08* (2013.01)
USPC ................................. 365/185.17; 365/185.18

(58) Field of Classification Search
USPC .............. 365/185.17, 185.18, 185.28, 185.33
See application file for complete search history.

(56) References Cited

U.S. PATENT DOCUMENTS

| | | | |
|---|---|---|---|
| 6,181,599 B1 | 1/2001 | Gongwer | |
| 6,370,062 B2 | 4/2002 | Choi | |
| 6,469,933 B2 | 10/2002 | Choi et al. | |
| 7,023,739 B2 | 4/2006 | Chen et al. | |
| 7,321,510 B2 * | 1/2008 | Li et al. ..................... | 365/185.1 |
| 7,369,439 B2 | 5/2008 | Kamigaichi et al. | |
| 7,629,068 B2 | 12/2009 | Hoffjann et al. | |
| 7,924,616 B2 | 4/2011 | Moschiano et al. | |
| 2007/0025152 A1 | 2/2007 | Futatsuyama | |
| 2007/0047326 A1 | 3/2007 | Nguyen et al. | |
| 2007/0109862 A1 | 5/2007 | Kim et al. | |
| 2009/0016112 A1 | 1/2009 | Lee | |
| 2009/0073761 A1 | 3/2009 | Hemink | |
| 2010/0128534 A1 | 5/2010 | Moschiano et al. | |

* cited by examiner

*Primary Examiner* — Vu Le

(74) *Attorney, Agent, or Firm* — Dorsey & Whitney LLP

(57) ABSTRACT

The voltage of a selected word line is increased beyond the voltage to which a respective string driver transistor is capable of driving the word line by capacitively coupling a voltage to the selected word line from adjacent word lines. The voltage is capacitively coupled to the selected word line by increasing the voltages of the adjacent word lines after a programming voltage has been applied to a string driver transistor for the selected word line and after a string driver voltage has been applied to the gates of all of the string driver transistors in an array.

20 Claims, 5 Drawing Sheets

LINE VOLTAGE BOOST SYSTEM AND METHOD FOR NON-VOLATILE MEMORY DEVICES AND MEMORY DEVICES AND PROCESSOR-BASED SYSTEM USING SAME

CROSS REFERENCE TO RELATED APPLICATION(S)

This application is a continuation of U.S. patent application Ser. No. 13/070,121, filed Mar. 23, 2011, which is a divisional of U.S. patent application Ser. No. 11/795,357, filed Jul. 12, 2007, U.S. Pat. No. 7,924,616 issued Apr. 12, 2011, which application is a 35 U.S.C. §371 filing of Foreign Application No. PCT/US2007/068220, filed May 4, 2007. These applications and patent are incorporated herein by reference, in their entirety, for any purpose.

TECHNICAL FIELD

This invention relates to non-volatile memory devices, and, more particularly, to a system and method for boosting the programming voltage applied to a selected word line of non-volatile memory devices.

BACKGROUND

A typical NAND flash memory device 10 is shown in FIG. 1. The device 10 is comprised of a large number of flash memory cells, collectively indicated by reference numeral 14. The array of flash memory cells 14 is typically divided into a number of blocks, one of which is shown in FIG. 1. Each block includes a number of rows, which, in the example shown in FIG. 1, includes 32 rows, and a number of columns, which, in the example shown in FIG. 1, includes 1600 columns. The cells 14 in the same row have their control gates coupled to a common word line 20, each of which receives a respective word line signal WL0-WL31 from a respective NMOS string driver transistor 22. The gates of all of the string drive transistors 22 are coupled to a common gate driver 23, which applies either ground or an elevated string driver voltage "Vstrdrv" to the gates of the transistors 22. The drains of the string driver transistors 22, which are normally part of a row decoder (not shown), are coupled to respective global word lines ("GWL") 24. The global word lines 24 are connected to a global word line driver 26, which serves as a voltage selector circuit.

As further shown in FIG. 1, the global word line driver 26 includes a row decoder 28 coupled to receive voltages from an analog voltage supply circuit 30. The voltage generated by the analog voltage supply circuit 30 includes a programming voltage Vpgm, a pass voltage Vpass, and a bias voltage Vbias1. (FIG. 1 also shows the analog voltage supply circuit 30 as generating a second bias voltage Vbias2, but this bias voltage is not used in prior art devices and can be ignored for now). The analog voltage supply circuit 30 is controlled by a first set of control signals. The row decoder 28 also receives a row address RA. The row decoder 28 includes a respective voltage selector 32 for each of the global word lines 24. The voltage selectors 32 couple the voltages from the voltage supply circuit 30 to selected ones of the string driver transistors 22 responsive to a second set of control signals. The first set of control signals that are received by the analog voltage supply circuit 30 and the second set of signals that are received by the voltage selectors 32 are generated by a micro controller 34, although other control devices could be used.

In operation, the micro controller 34 causes each of the voltage selectors 32 to apply a voltage to its respective global word line 24 depending on the operation being performed and the row address, which is indicative of the row of memory cells 14 on which the operation is being performed. More specifically, each of the selectors 32 can apply either a programming voltage Vpgm, a pass voltage Vpass, or a bias voltage Vbias1 to its respective global word line 24, which is then coupled by the respective string driver transistor 22 to the respective word line 20.

As also shown in FIG. 1, the cells 14 in the same column have their sources and drains connected to each other in series. Thus all of the memory cells 14 in the same column of each block are typically connected in series with each other. The drain of the upper flash memory cell 14 in the block is coupled to a bit line 40 through a first select gate transistor 42. The conductive state of the transistors 42 in each block are controlled by a select gate drain ("sgd") signal, which is generated by an NMOS string driver transistor 44. Each of the bit lines 40 output a respective bit line signal BL0-BLN indicative of the data bit stored in the respective column of the array of memory cells 14. The bit lines 40 extend through multiple blocks to respective sense amplifiers (not shown). The source of the lower flash memory cell 14 in the block is coupled to a source line 46 through a second select gate transistor 48. The conductive state of the transistors 48 in each block are controlled by a select gate source ("sgs") signal, which is also generated by an NMOS string driver transistor 50. The source line 46 receives a signal SRC having various magnitudes depending upon whether the memory cells 14 are being programmed, read or erased.

As mentioned above, the voltage that the voltage selectors 32 apply to the respective word lines 20 depends on which row of memory cells 14 are "active," i.e., which row is being programmed, erased or read. The word line 20 for the active row is referred to as a "local wln" word line, the word lines 20 adjacent the selected word line are referred to as the "local wln+1" and "local wln−1," the word lines adjacent those word lines are referred to as the "local wln+2" and "local wln−2," and the remaining word lines are referred to as "unselected" word lines.

The manner in which the string driver transistors 22 are driven is shown in FIG. 2. At time $t_0$, the gate driver 23 (FIG. 1) applies the Vstrdry voltage to the gates of the string driver transistors 22. Shortly thereafter at time $t_1$, voltage selectors 32 apply a bias voltage Vbias1 to the drains of the string driver transistors 22 for the word lines WLn±1 and WLn±2 adjacent the active row. At time $t_2$, the respective voltage selectors 32 apply the Vpass voltage to the drains of all of the string driver transistors 22 for all of the unselected word lines. Finally, at time $t_3$, the respective voltage selector 32 applies the Vpgm voltage to the drain of the string driver transistors 22 for the word line WLn of the active row.

As also shown in FIG. 2, even though the programming voltage Vpgm may be substantially greater than the Vstrdry voltage, the word line WLn of the active row is not driven to the level of the Vstrdry voltage. Instead, the word line WLn is driven to the Vstrdry voltage less the threshold voltage $V_T$ of the string driver transistor 22 for the active row. As a result, it may not be possible to drive the voltage of the WLn of the active row to a level that is sufficient to provide optimal programming efficiency. More specifically, as shown in FIG. 3, the micro controller 34 normally causes the analog voltage supply circuit 30 to generate the voltages from the circuit 30 in the form of respective series of pulses that may sequentially increase in amplitude. After each set of pulses, the memory cells 14 in the row being programmed are normally read to determine if the cells have been programmed to target charge levels. If so, further programming is terminated. This iterative "program and then verify" is particularly important for multi-level memory cells in which the memory cells 14 are programmed to one of four or more levels.

The program voltage Vpgm is normally generated by the analog voltage supply circuit 30 as successive pulses of incrementally increasing magnitude, one of which is shown in FIG. 2. Unfortunately, the string driver transistors 22 are sometimes unable to pass these increases in the magnitude of Vpgm pulses beyond the magnitude of the programming voltage Vpgm less the threshold voltage $V_T$ of the string driver transistor 22. For example, as further shown in FIG. 3, the pulses of Vpgm sequentially increase as follows: 16v, 16.5v, 17v, 17.5v, 18v, 18.5v, 19v, 19.5v. In this example, it is assumed the Vstrdry voltage is 20 volts, and the threshold voltage $V_T$ of the string driver transistor 22 is 2 volts. Therefore, the string driver transistor 22 cannot apply more than 18 volts to the word line WLn regardless of the level of Vpgm. As a result, once the pulses of Vpgm reaches 18 volts, the voltage on the word line WLn remains at 18 volts even though the pulses of Vpgm continue to increase, as shown by the dotted lines in FIG. 3. The string driver transistors 22 are therefore unable to apply the full magnitude of the Vpgm voltage to the word line WLn of the active row, thereby limiting programming efficiency.

The problem of the string driver transistors 22 being unable to apply the full magnitude of the programming voltage Vpgm to the selected word line 20 can also exist with the string driver transistors 44, 50 for the select gate transistors 42, 48. Further, although the problem of string driver transistors being unable to apply the full magnitude of voltages applied to their drains has been explained in the context of a flash memory device, it will be understood that the problem can also exist in other types of non-volatile memory devices.

There is therefore a need for a circuit and method that can allow string driver transistors to apply voltages to word lines as well as possibly select gate and other lines with reduced loss in voltage across the string driver transistors.

DETAILED DESCRIPTION

Embodiments of the present invention are directed to non-volatile memory devices in which a word line decoder size is reduced. Certain details are set forth below to provide a sufficient understanding of the embodiments of the invention. However, it will be clear to one skilled in the art that embodiments of the invention may be practiced without these particular details. In other instances, well-known circuits, control signals, and timing protocols have not been shown in detail in order to avoid unnecessarily obscuring the embodiments of the invention.

Figure 1:
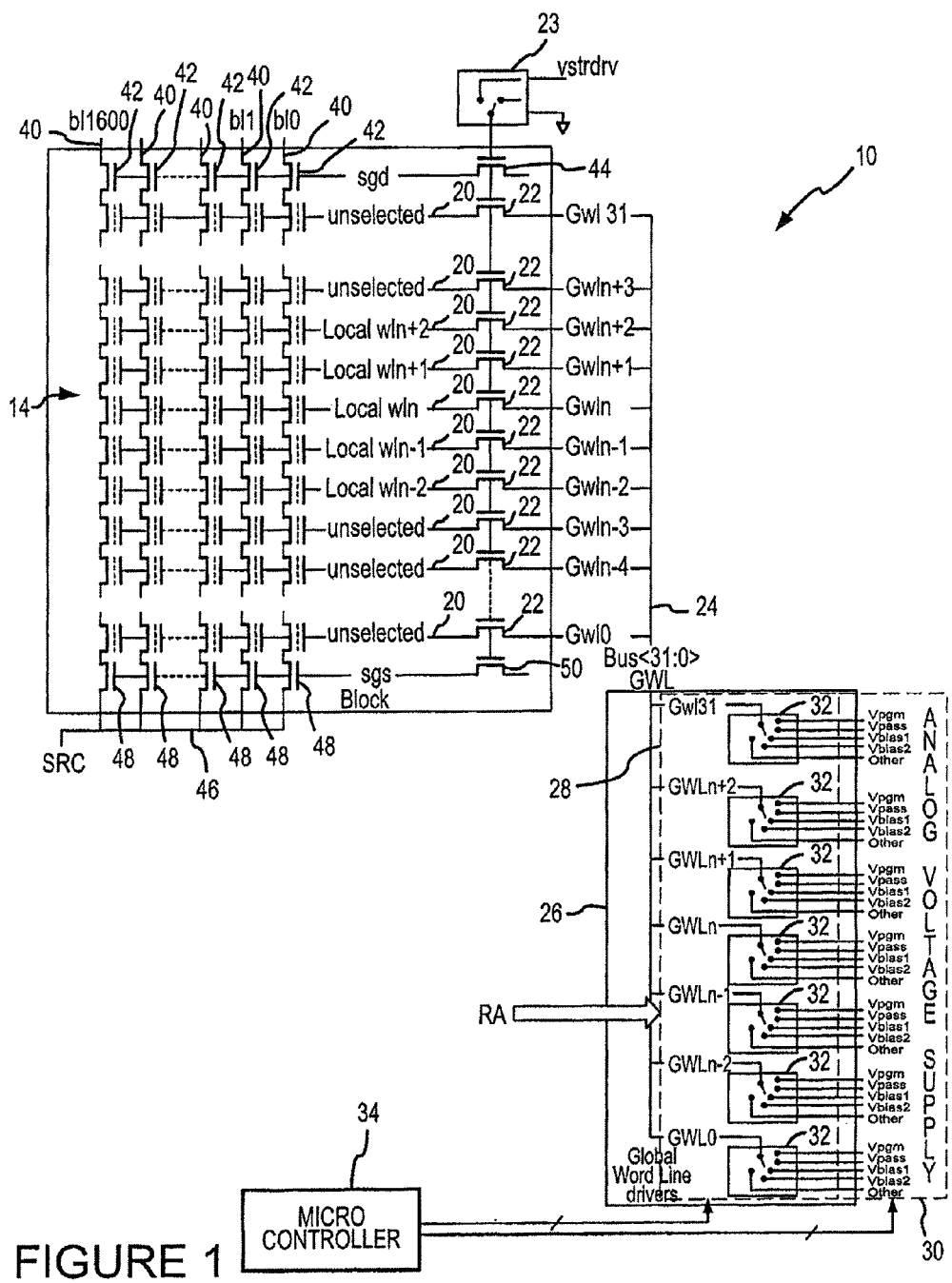
FIG. 1 is a schematic diagram showing a NAND flash memory device that can be programmed according to prior art techniques or according to embodiments of the invention.
Figure 2:
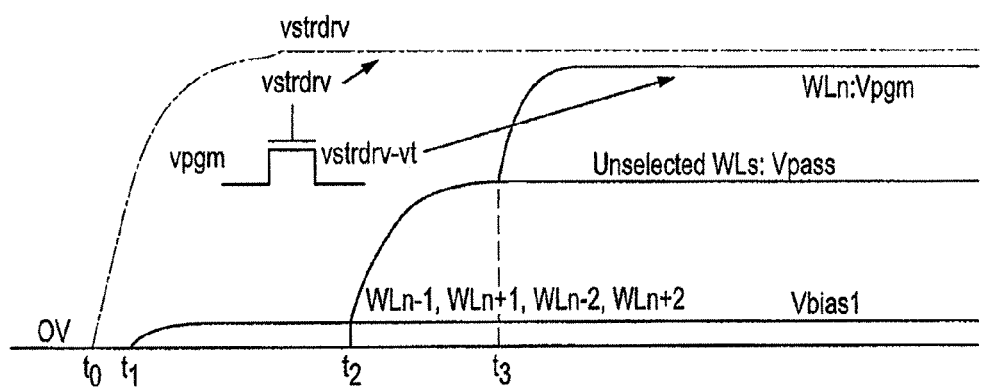
FIG. 2 is a timing diagram illustrating the manner in which various signals are applied to word lines of flash memory devices in the prior art.
Figure 4:
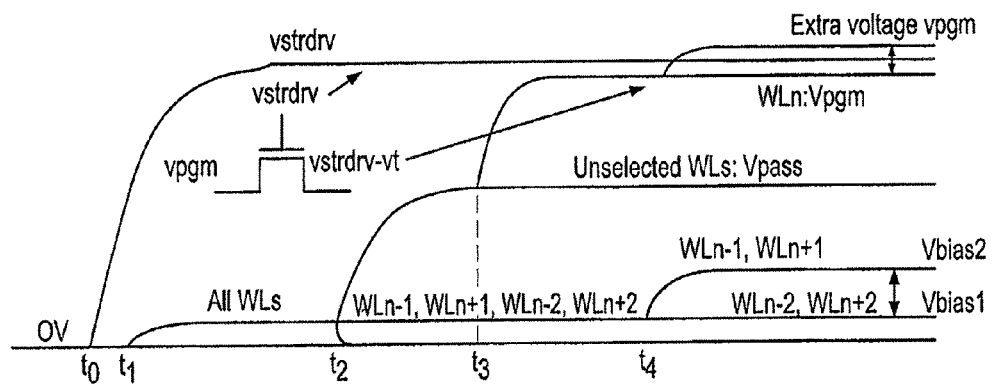
FIG. 4 is a timing diagram showing the manner in which signals are applied to word lines according to an embodiment of the invention.

The manner in which the string driver transistors 22 shown in FIG. 1 are driven according to an embodiment of the invention is shown in FIG. 4. At time $t_0$, the gate driver 23 (FIG. 1) applies the Vstrdry voltage to the gates of the string driver transistors 22 in the same manner as shown in FIG. 2. At time $t_1$, the voltage selectors 32 apply a first bias voltage Vbias1 to the drains of the string driver transistors 22 for the word lines WLn+1 and WLn±2 adjacent the active row. As in the prior art approach shown in FIG. 2, this bias voltage vbias1 may be 0 volts or some other voltage value. At time $t_2$, the voltage selectors 32 apply the Vpass voltage to the drains of all of the string driver transistors 22 for all of the unselected word lines. Also, at time $t_3$, the respective voltage selector 32 applies the Vpgm voltage to the drain of the string driver transistors 22 for the word line WLn of the active row. These operations at times $t_2$ and $t_3$ are also the same as in the operation of a prior art memory device as shown in FIG. 2

Figure 3:
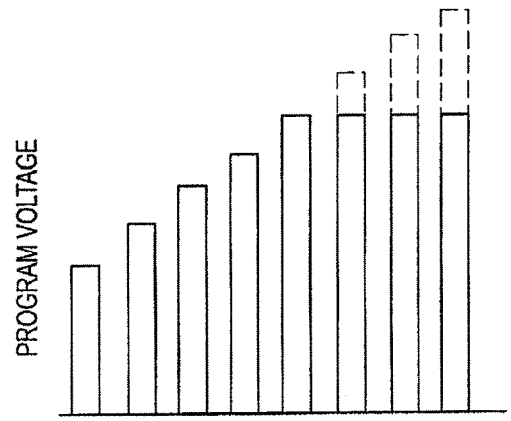
FIG. 3 is a schematic diagram illustrating the prior art technique in which the flash cells shown in FIG. 1 are programmed to store one or more data bits responsive to the signals shown in FIG. 2.

As explained above with reference to FIGS. 2 and 3, the maximum voltage of the selected word line WLn will be Vpgm less the threshold voltage $V_T$ of the string driver transistor 22 for the word line WLn. The memory device according to an embodiment of the invention avoids this problem by boosting the voltage of the word lines WLn±1 adjacent the selected word line WLn from the first bias voltage vbias1 to a second bias voltage vbias2 at time $t_4$. Thus, the analog voltage supply circuit 30 in a memory device according to an embodiment of the invention generates two biases voltages—Vbias1 and Vbias2—in addition to the programming voltage Vpgm and the pass voltage Vpass. The increase in voltage of the adjacent word lines WLn±1 is capacitively coupled to the selected word line WLn thereby boosting the voltage of the selected word line WLn at time $t_4$. As shown in FIG. 4, the voltage of the selected word line WLn is increased to a voltage that is greater than the programming voltage Vpgm. The voltage of the selected word line WLn can therefore be greater than Vpgm less the threshold voltage $V_T$ of the string driver transistor 22 for the selected word line WLn.

As with the operation of prior art memory devices as shown in FIG. 2, the voltages shown in FIG. 4 are applied to the drains of the string driver transistors 22 as a series of pulses. Before the magnitude of the program voltage Vpgm reaches the string driver voltage Vstrdry less the threshold voltage $V_T$, the extra boost of the selected word line WLn resulting from increasing the voltage of the adjacent word lines WLn±1 is not needed. In fact, it would be difficult for the increasing voltage of the adjacent word lines WLn±1 to significantly increase the voltage of the selected word lines WLn before this point because the string driver transistor 22 for the selected word line WLn would be ON. As a result, the relatively low output impedance of the voltage selector 32 for the selected word line WLn would hold the selected word line WLn at the program voltage Vpgm. However, once the program voltage Vpgm reaches the voltage Vstrdry less the threshold voltage $V_T$, the string driver transistor 22 for the selected word line is turned OFF. Thereafter, the increasing voltage of the adjacent word lines WLn±1 that is capacitively coupled to the selected word line WLn is able to significantly increase the voltage of the selected word line WLn since the word line WLn is no longer being driven by a low impedance source.

Figure 5:
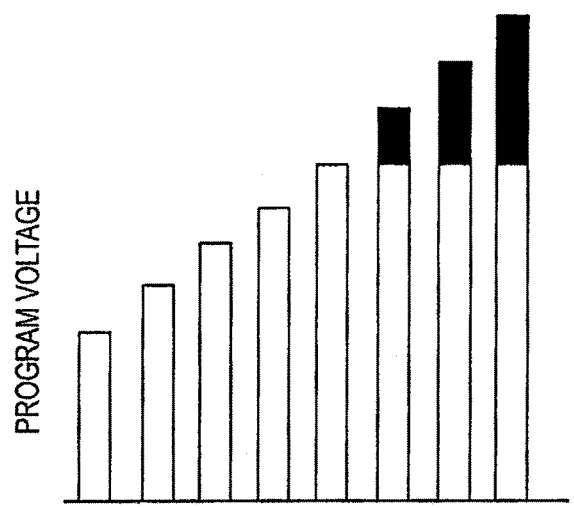
FIG. 5 is a schematic diagram showing the manner in which the flash cells shown in FIG. 1 are programmed to store one or more data bits responsive to the signals shown in FIG. 4 according to an embodiment of the invention.

The manner in which increasing the voltage of the adjacent word lines WLn±1 can cause the voltage of the selected word line WLn to be increased beyond Vstrdry less $V_T$, is shown by way of example in FIG. 5. As with the example shown in FIG. 3, the pulses of Vpgm are sequentially increased as follows: 16v, 16.5v, 17v, 17.5v, 18v, 18.5v, 19v, 19.5v. In this example, it is again assumed the Vstrdry voltage is 20 volts, and the threshold voltage $V_T$ of the string driver transistor 22 is 2 volts. Therefore, the string driver transistor 22 is unable to apply more than 18 volts to the word line WLn regardless of the level of Vpgm. However, once the pulses of Vpgm reaches 18 volts, the voltages of the word lines WLn±1 adjacent the selected word line WLn are increased at time $t_4$ from Vbias1 to sequentially increasing values of Vbias2. As a result, the voltage pulses applied to the selected word line can continue to increase beyond the 18 volt magnitude to which the voltage of the selected word line WLn is limited using the prior art approach shown in FIGS. 2 and 3. More specifically, the voltage pulses of the selected word line increase from 18v to 18.5v to 19v and finally to 19.5v, as shown in FIG. 5. This increased voltage of the selected word line WLn allows the memory cells coupled to the selected word line to be more efficiently programmed.

Figure 6:
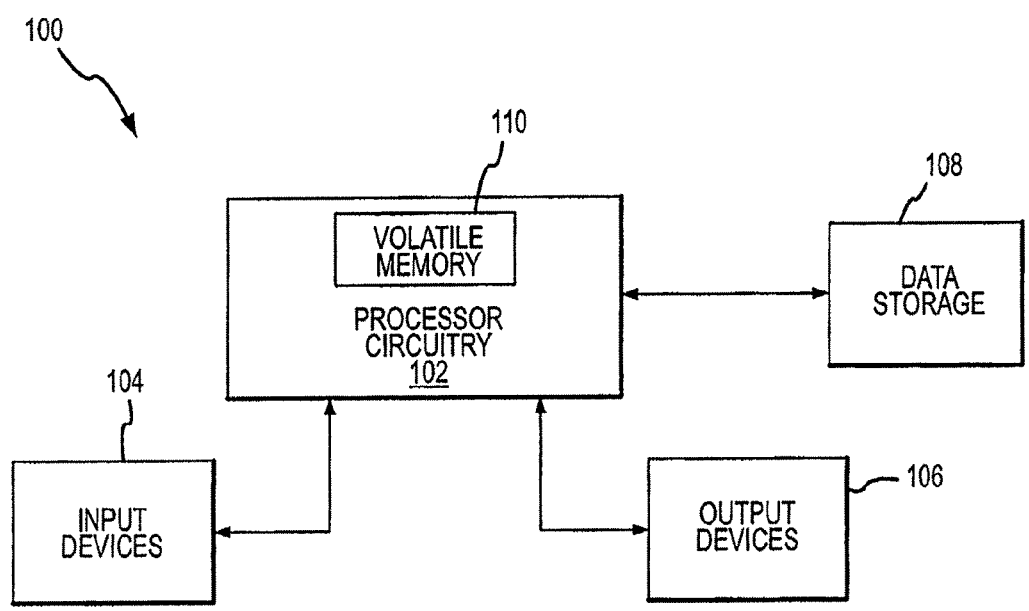
FIG. 6 is a simplified block diagram of a processor-based system including the flash memory device of FIG. 1 operating as shown in FIGS. 4 and 5 or according to some other embodiment of the invention.

FIG. 6 is a block diagram of a processor-based system 100 including processor circuitry 102 having volatile memory 110. The processor circuitry 102 is coupled through address, data, and control buses to the volatile memory 110 to provide for writing data to and reading data from the volatile memory 110. The processor circuitry 102 includes circuitry for performing various processing functions, such as executing specific software to perform specific calculations or tasks. The processor-based system 100 also includes one or more input devices 104 coupled to the processor circuitry 102 to allow an operator to interface with the processor-based system 100. Examples of input devices 104 include keypads, touch screens, and scroll wheels. The processor-based system 100 also includes one or more output devices 106 coupled to the processor circuitry 102 to provide output information to the operator. In one example, the output device 106 is a visual display providing visual information to the operator. Data storage 108 is also coupled to the processor circuitry 102 to store data that is to be retained even when power is not supplied to the processor-based system 100 or to the data storage 108. The NAND flash memory device 10 shown in FIG. 1 having an analog voltage supply circuit 30 generating both Vbias1 and Vbias2 and operating as shown in FIGS. 4 and 5 or according to some other embodiment of the invention may be used for the data storage 108.

Although embodiments of the present invention has been specifically described, persons skilled in the art will recognize that changes may be made in form and detail without departing from the spirit and scope of the embodiments of the invention. Such modifications are well within the skill of those ordinarily skilled in the art.

We claim:

1. A method, comprising:
applying a program voltage to a node of a driver transistor coupled to a selected access line of a memory; and
after applying the program voltage to the node of the driver transistor, increasing a voltage of an access line that is adjacent to the selected access line.

2. The method of claim 1, further comprising providing a bias voltage to the access line that is adjacent to the selected access line prior to applying the program voltage to the node of the driver transistor.

3. The method of claim 2, wherein the bias voltage is a first bias voltage, and wherein increasing the voltage of the access line that is adjacent to the selected access line comprises providing a second bias voltage to the access line that is adjacent to the selected access line.

4. The method of claim 1, further comprising providing a driver voltage to a gate of the driver transistor.

5. The method of claim 4, wherein increasing the voltage of the access line that is adjacent to the selected access line is responsive to the program voltage exceeding the driver voltage less a threshold voltage of the driver transistor.

6. The method of claim 1, wherein applying a program voltage to the node of the driver transistor comprises applying a series of pulses to the node of the driver transistor.

7. The method of claim 1, wherein the node of the driver transistor is the drain of the driver transistor.

8. A method, comprising:
during a program operation:
applying a first voltage to a first access line of a memory and to a second access line of the memory, the first access line adjacent to the second access line;
applying a second voltage to the first access line that is greater than the first voltage; and
after applying the second voltage to the first access line, applying a third voltage to the second access line that is greater than the first voltage and less than the second voltage.

9. The method of claim 8, wherein applying the first voltage to the first access line and to the second access line comprises applying the first voltage to a drain of a first driver transistor coupled to the first access line and to a second driver transistor coupled to the second access line.

10. The method of claim 9, further comprising enabling the first driver transistor and the second driver transistor.

11. The method of claim 10, wherein enabling the first driver transistor and the second driver transistor comprises providing a driver voltage to a gate of the first driver transistor and to a gate of the second driver transistor.

12. The method of claim 11, wherein applying the third voltage to the second access line is after the second voltage exceeds the driver voltage less a threshold voltage of the first driver transistor.

13. The method of claim 11, wherein applying the second voltage to the first access line comprises providing a series of pulses having increasing voltages to the first access line.

14. The method of claim 8, further comprising applying a fourth voltage to a third access line after applying the first voltage and before applying the third voltage.

15. An apparatus comprising:
a plurality of string driver transistors coupled to respective ones of a plurality of access lines;
a voltage selector circuit coupled to the plurality of string driver transistors, the voltage selector circuit configured to apply a program voltage to a selected string driver transistor of the plurality of string driver transistors, the voltage selector circuit further configured to, after application of the program voltage to the string driver transistor, increase a voltage of an adjacent access line that is adjacent to an access line coupled to the selected string driver transistor.

16. The apparatus of claim 15, wherein the voltage selector circuit is configured to apply a first voltage to a string driver transistor of the plurality of string driver transistors coupled to the adjacent access line prior to application of the program voltage to the selected string driver transistor, and wherein the voltage selector circuit is further configured to apply a second voltage that is greater than the first voltage to the string driver transistor of the plurality of string driver transistors coupled to the adjacent access line after application of the program voltage to the selected string driver transistor.

17. The apparatus of claim 16, wherein the voltage selector circuit is configured to apply the second voltage to the string driver transistor of the plurality of string driver transistors coupled to the adjacent access line responsive to the program voltage exceeding a gate voltage of the selected string driver transistor less a threshold voltage of the selected string driver transistor.

18. The apparatus of claim 16, further comprising a voltage supply circuit coupled to the voltage selector circuit and configured to provide the program voltage, the first voltage, and the second voltage to the voltage selector circuit.

19. The apparatus of claim 15, further comprising a plurality of rows of memory cells, wherein rows of the plurality of rows of memory cells are coupled to respective ones of the plurality of string driver transistors.

20. The apparatus of claim 15, wherein the plurality of string driver transistors are n-type transistors.

* * * * *